(12) United States Patent
Sugiura et al.

(10) Patent No.: US 7,508,725 B2
(45) Date of Patent: Mar. 24, 2009

(54) SEMICONDUCTOR MEMORY DEVICE

(75) Inventors: Yoshihisa Sugiura, Kamakura (JP); Atsushi Inoue, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 209 days.

(21) Appl. No.: 11/668,917

(22) Filed: Jan. 30, 2007

(65) Prior Publication Data
US 2007/0245182 A1 Oct. 18, 2007

(30) Foreign Application Priority Data
Jan. 31, 2006 (JP) ............................. 2006-023483

(51) Int. Cl.
*G11C 7/00* (2006.01)
(52) U.S. Cl. .................... 365/201; 365/189.07; 365/206
(58) Field of Classification Search ................ 265/201, 265/206; 365/189.07
See application file for complete search history.

(56) References Cited

U.S. PATENT DOCUMENTS

| | | | |
|---|---|---|---|
| 5,781,478 A | 7/1998 | Takeuchi et al. | |
| 5,920,507 A | 7/1999 | Takeuchi et al. | |
| 6,069,823 A | 5/2000 | Takeuchi et al. | |
| 6,147,911 A | 11/2000 | Takeuchi et al. | |
| 6,272,588 B1 * | 8/2001 | Johnston et al. | ............. 711/106 |
| 6,307,785 B1 | 10/2001 | Takeuchi et al. | |
| 6,819,596 B2 * | 11/2004 | Ikehashi et al. | ........ 365/185.22 |

FOREIGN PATENT DOCUMENTS

| | | |
|---|---|---|
| JP | 2647321 | 5/1997 |
| KR | 2001-67326 | 7/2001 |

OTHER PUBLICATIONS

U.S. Appl. No. 08/747,823, filed Nov. 13, 1996, Takeuchi, et al.

* cited by examiner

*Primary Examiner*—Son Dinh
(74) *Attorney, Agent, or Firm*—Oblon, Spivak, McClelland, Maier & Neustadt, P.C.

(57) ABSTRACT

A semiconductor memory device is disclosed, which includes a memory cell array including a plurality of memory cells, a built-in self-test circuit which writes test pattern data including binary 0 and binary 1 in the memory cells in units of a page to perform a test for the memory cells, a plurality of sense amplifiers which hold a plurality of data read from the memory cells in units of a page, and a detection circuit which collectively detects the plurality of data held by the sense amplifiers and outputs a detection result to the built-in self-test circuit.

15 Claims, 15 Drawing Sheets

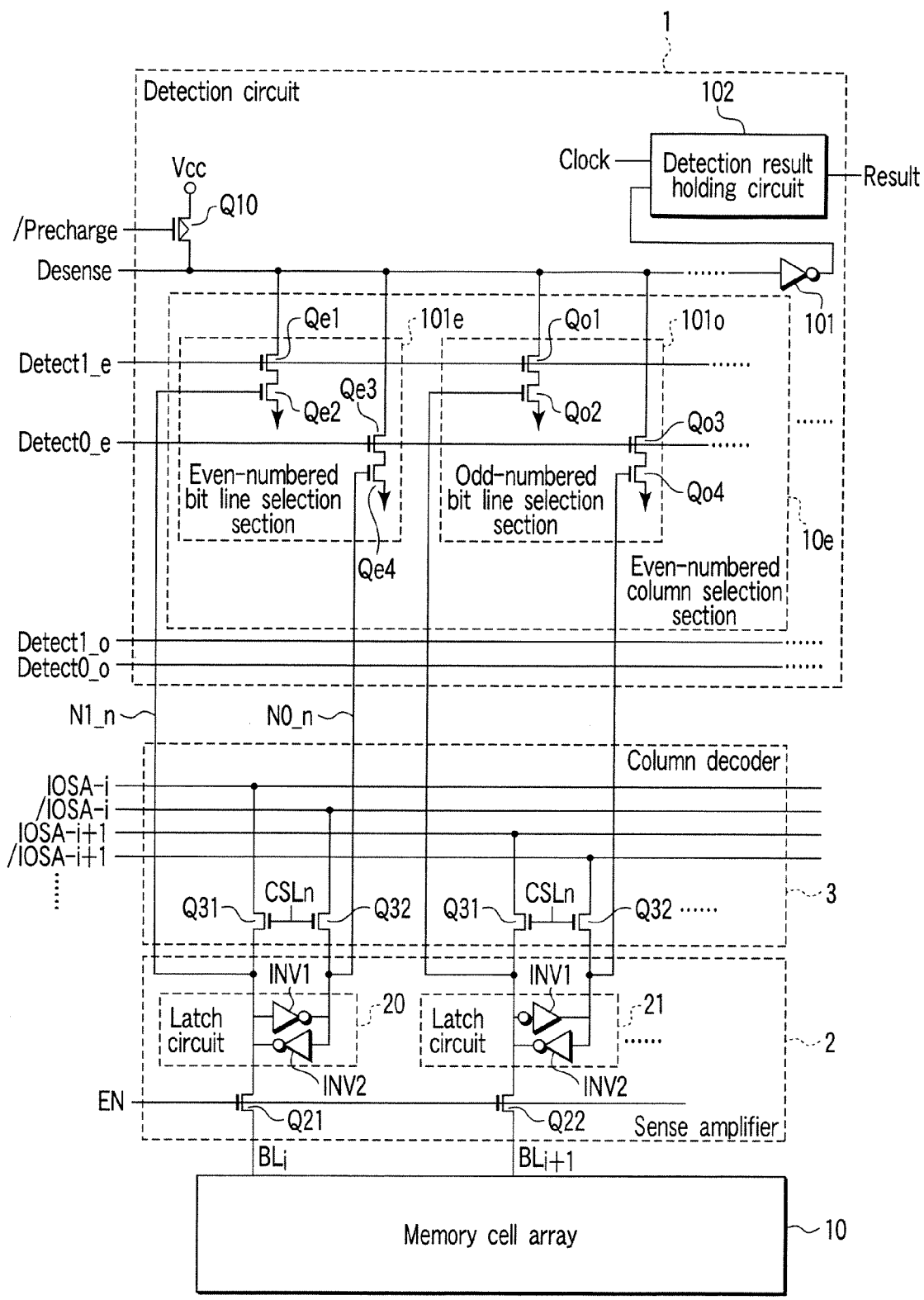
F I G. 4

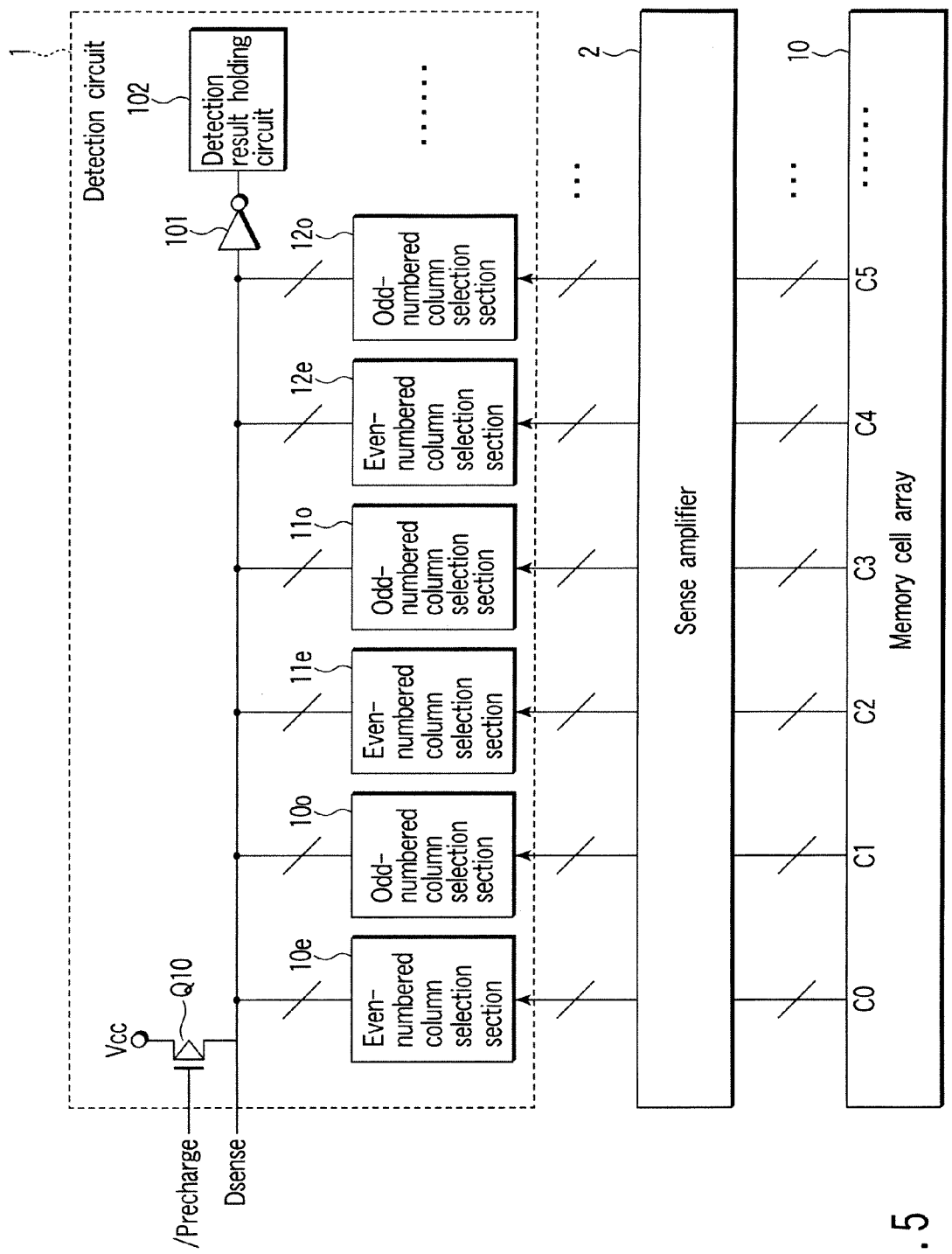
F I G. 5

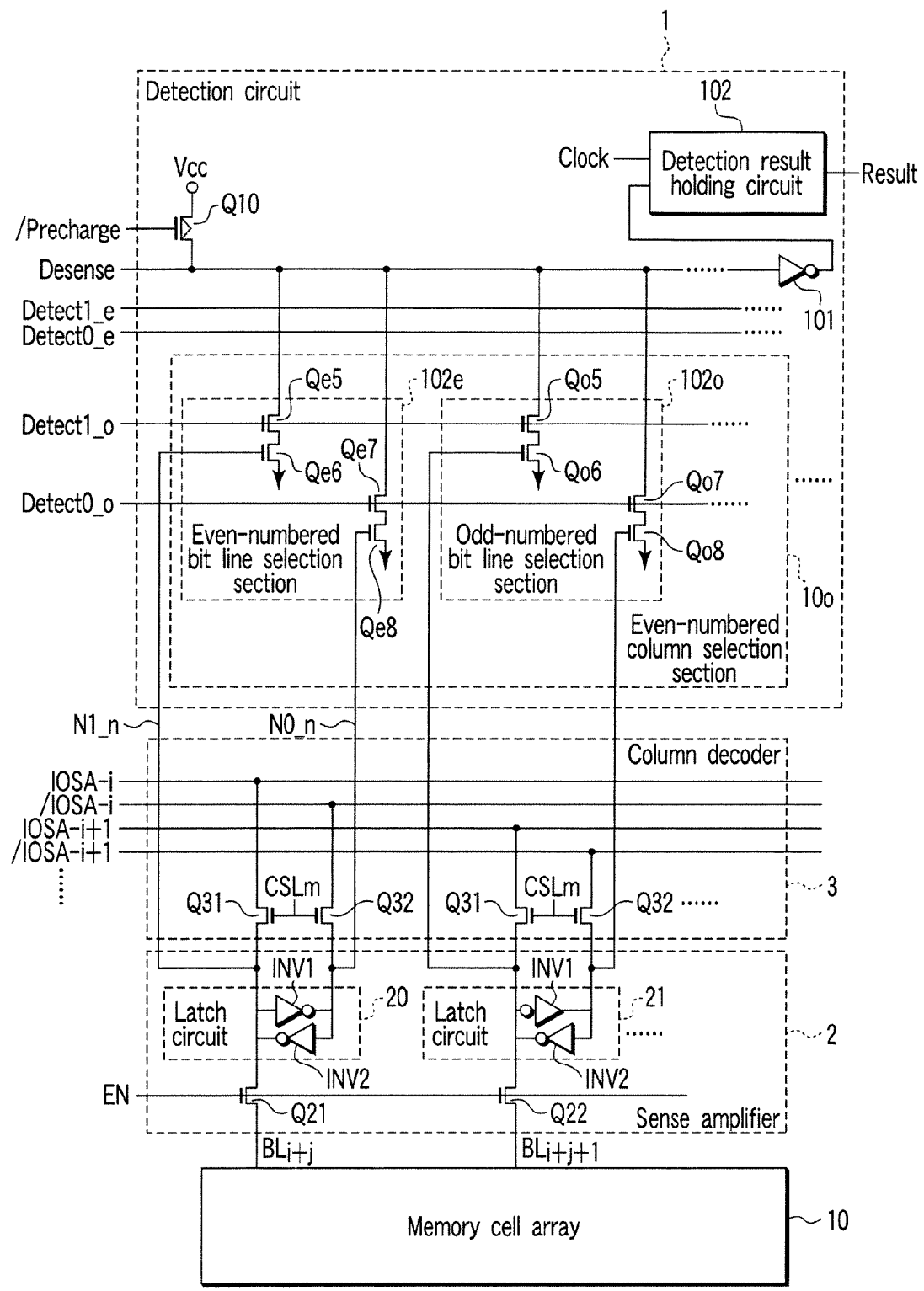
F I G. 6

|    | C0 | C1 | C2 | C3 | C4 | C5 |
|----|----|----|----|----|----|----|
| P0 | FF | 00 | FF | 00 | FF | 00 |
| P1 | 00 | FF | 00 | FF | 00 | FF |
| P2 | FF | 00 | FF | 00 | FF | 00 |
| P3 | 00 | FF | 00 | FF | 00 | FF |
| P4 | FF | 00 | FF | 00 | FF | 00 |
| P5 | 00 | FF | 00 | FF | 00 | FF |

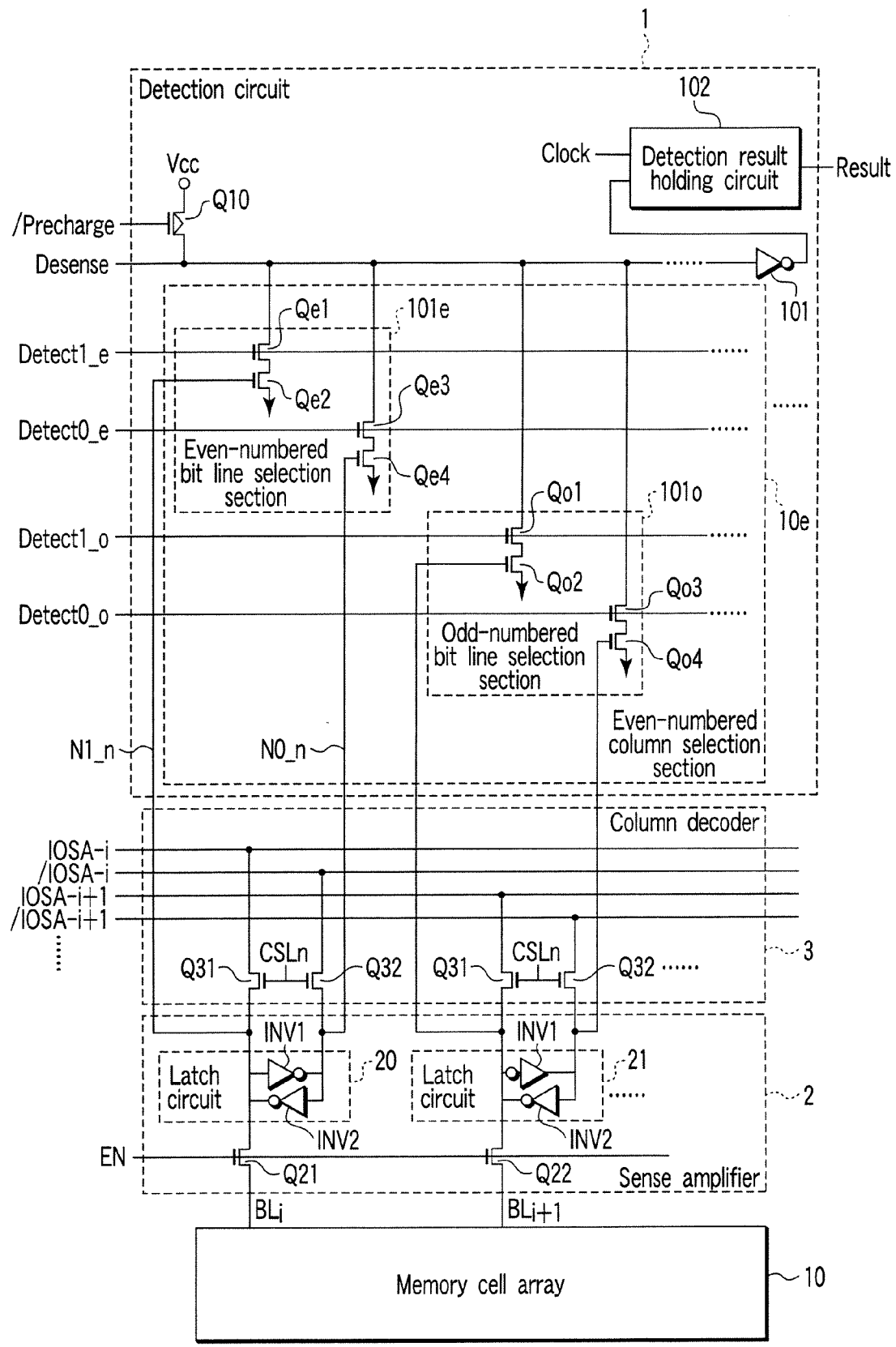
F I G. 11

|    | C0 | C1 | C2 | C3 | C4 | C5 |
|----|----|----|----|----|----|----|
| P0 | AA | AA | AA | AA | AA | AA |
| P1 | 55 | 55 | 55 | 55 | 55 | 55 |
| P2 | AA | AA | AA | AA | AA | AA |
| P3 | 55 | 55 | 55 | 55 | 55 | 55 |
| P4 | AA | AA | AA | AA | AA | AA |
| P5 | 55 | 55 | 55 | 55 | 55 | 55 |

FIG. 13

SEMICONDUCTOR MEMORY DEVICE

CROSS-REFERENCE TO RELATED APPLICATIONS

This application is based upon and claims the benefit of priority from prior Japanese Patent Application No. 2006-023483, filed Jan. 31, 2006, the entire contents of which are incorporated herein by reference.

BACKGROUND OF THE INVENTION

1. Field of the Invention

The present invention relates to a semiconductor memory device and, more particularly, to a semiconductor memory device having a built-in self-test (BIST) circuit.

2. Description of the Related Art

In a NAND flash memory which is one of a semiconductor memory device, write and read operations are performed in units of a page size of 512 bytes or 2 Kbytes depending on the product type. In order to enable the write or read operation to be performed in units of a page, sense amplifiers connected to bit lines one by one each serve also as a data register that temporarily holds data read from a memory cell (refer to, e.g., Japanese Patent No. 2647321).

The NAND flash memory incorporates a BIST circuit for automatically detecting the defect of a memory cell according to a sequence defined inside a product. In the BIST sequence, a bit line leak test, a bit line open test, data deletion, All Binary 0 write/read test, and All Binary 1 data write/read test (BIST) are automatically performed according to the sequence so as to detect the defect of a memory cell array.

In the All Binary 0 write/read test and All Binary 1 write/read test, after a test pattern of All Binary 0 or All Binary 1 has been written in a memory cell, the data is read to the sense amplifier in units of a page. When not all the data in a page are identical, it is determined that a read fail is detected as a defect.

However, in a conventional BIST, it has been possible to detect the defect only with a test pattern using an expectation value of All Binary 0 or All Binary 1. Therefore, detection efficiency of the defect has been low.

BRIEF SUMMARY OF THE INVENTION

According to an aspect of the present invention, there is provided a semiconductor memory device comprising:

a memory cell array including a plurality of memory cells;

a built-in self-test circuit which writes test pattern data including binary 0 and binary 1 in the memory cells in units of a page to perform a test for the memory cells;

a plurality of sense amplifiers which hold a plurality of data read from the memory cells in units of a page; and a detection circuit which collectively detects the plurality of data held by the sense amplifiers and outputs a detection result to the built-in self-test circuit.

BRIEF DESCRIPTION OF THE SEVERAL VIEWS OF THE DRAWING

FIG. 4 is a block diagram showing, in detail, a part of a sense amplifier, a column decoder, and a detection circuit in the semiconductor memory device according to the first embodiment of the present invention;

FIG. 5 is a block diagram schematically showing the memory cell array, sense amplifier, and detection circuit in the semiconductor memory device according to the first embodiment of the present invention;

FIG. 6 is a block diagram showing, in detail, a part of the sense amplifier, column decoder, and detection circuit in the semiconductor memory device according to the first embodiment of the present invention;

FIG. 11 is a block diagram showing a semiconductor memory device according to a modification of the semiconductor memory device according to the first embodiment, which shows a part of its detection circuit in detail;

FIG. 13 a view schematically showing an example of a bit-based checkerboard pattern in the semiconductor memory device according to the first embodiment of the present invention;

DETAILED DESCRIPTION OF THE INVENTION

Figure 1:
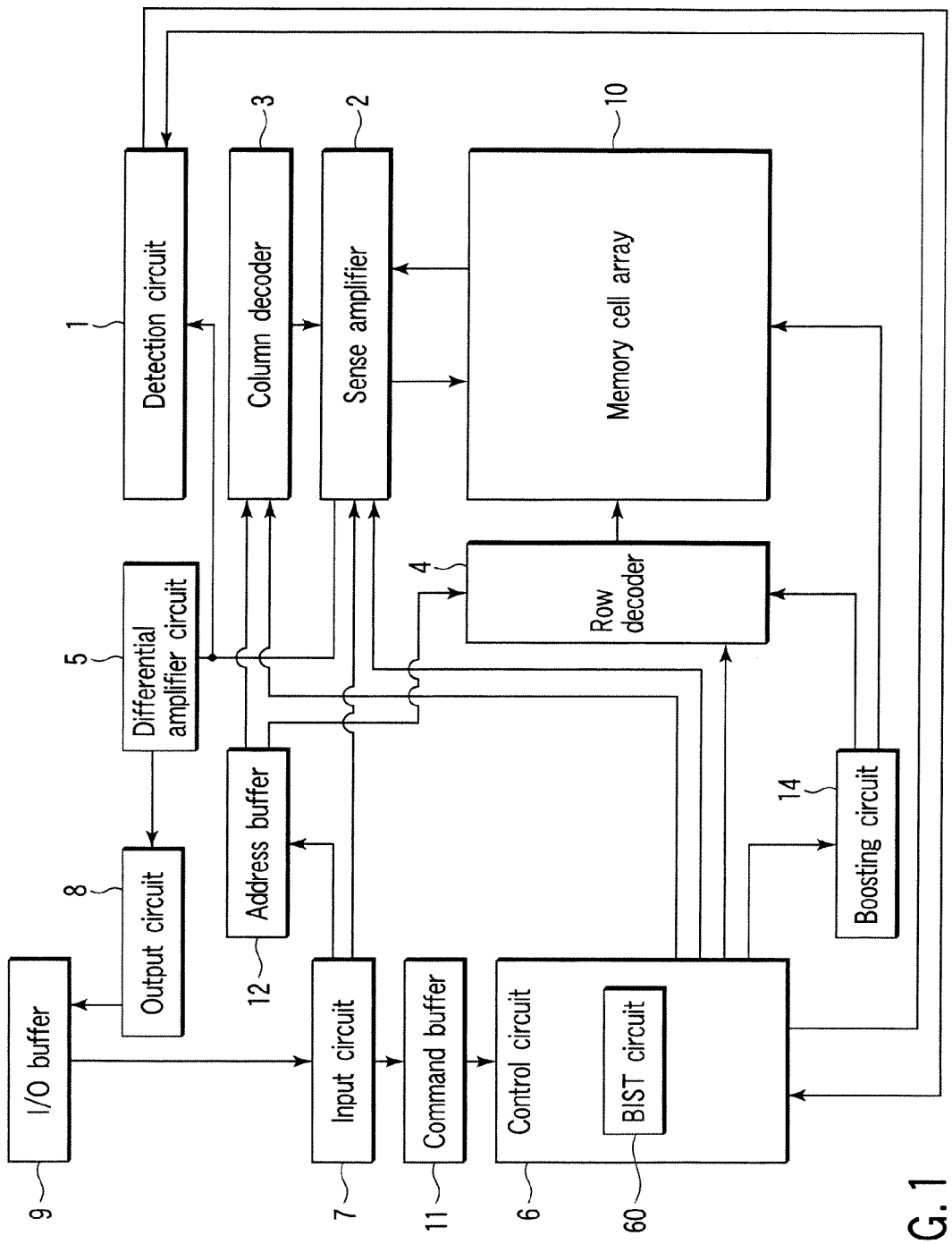
FIG. 1 is a block diagram showing an example of a semiconductor memory device (NAND flash memory) according to a first embodiment of the present invention.

First and second embodiments of the present invention will hereinafter be described with reference to the accompanying drawings. In the following description, the same reference numerals denote the same parts through the drawing.

First Embodiment

A semiconductor memory device according to a first embodiment of the present invention is a NAND flash memory including, as shown in FIG. 1, a memory cell array 10 composed of a plurality of memory cells, a built-in self-test (BIST) circuit 60 which writes test pattern data including binary 0 and binary 1 in a plurality of memory cells of the memory cell array 10 for each page to test the memory cells, a sense amplifier 2 which holds a plurality of data that have been read, for each page, from the memory cells in each of which the test pattern has been written, a detection circuit 1 which collectively detects a plurality of data held by the sense amplifier 2 and outputs detection results to the BIST circuit 60.

Figure 2:
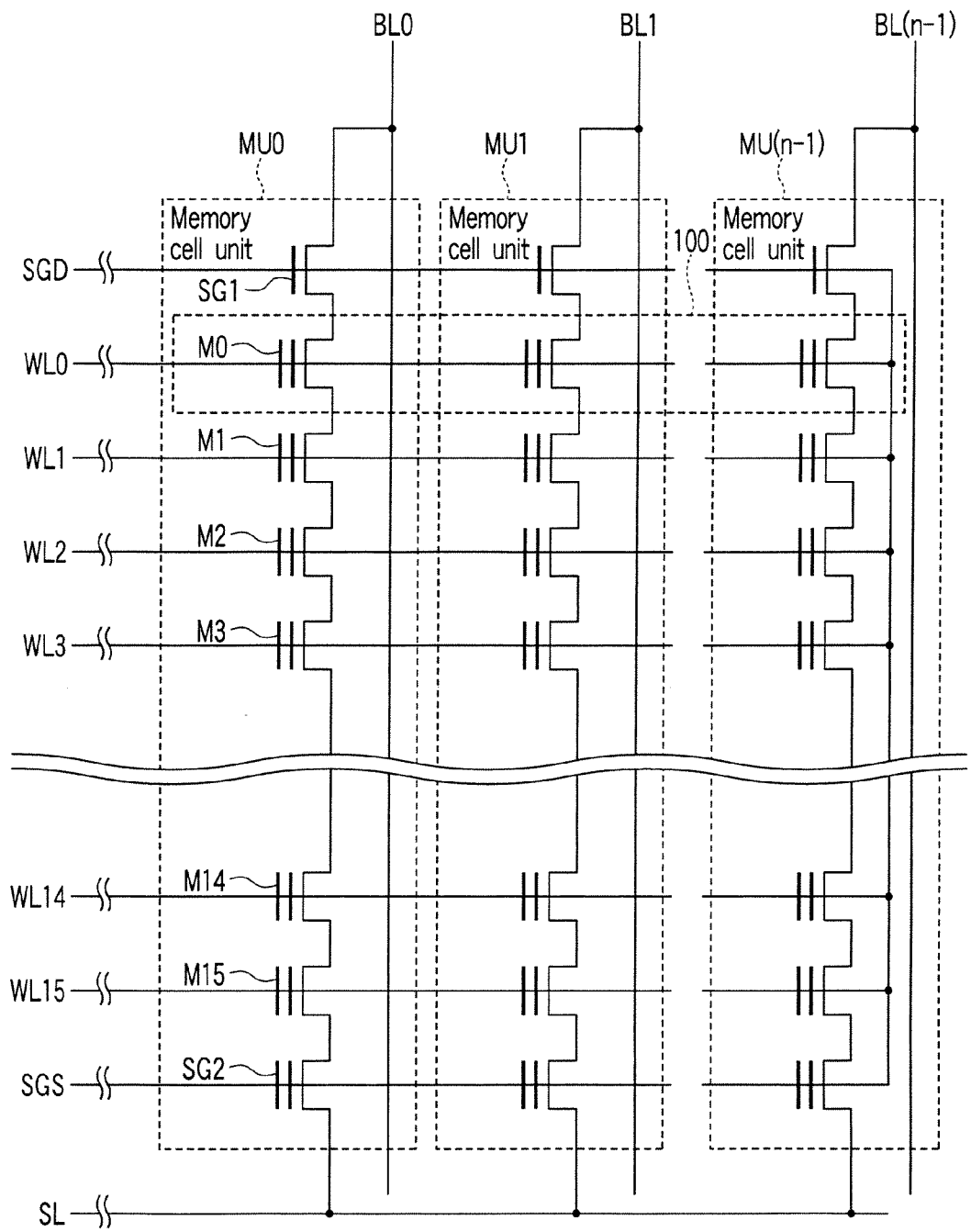
FIG. 2 is a circuit diagram showing an example of a memory cell array in the semiconductor memory device according to the first embodiment of the present invention.

In the NAND flash memory, data write and read operations are performed in units of a page. One page is typically composed of 512 bytes. In some products, one page is composed of 2 Kbytes. As shown in FIG. 2, the memory cell array 10 includes memory cell units MU0, MU1, ..., MU(n−1) (n is an integer number). The memory cell unit MU0 includes a plurality of series-connected memory cells M0 to M15 and two selection transistors SG1 and SG2 which are connected respectively to both ends of the plurality of series-connected memory cells M0 to M15. The gate electrodes of the memory cells M0 to M15 are connected respectively to word lines WL0 to WL 15. Other memory cell units (MU1 to MU(n−1)) each have the same configuration as that of the memory cell unit MU0.

The memory cell units MU0 to MU(n−1) are connected to a common source line SL through their respective selection transistors SG2. The memory cell units MU0 to MU(n−1) are connected respectively to bit lines BL1 to BL(n−1) through their respective selection transistors SG1. Further, although not shown, a large number of memory cell units are provided in the columns of the memory cell units MU0 to MU(n−1). For example, a page 100 is constructed by a plurality of memory cells which are arranged in the same row and connected to a common word line WL1.

As shown in FIG. 1, the memory cell array 10 is connected to the sense amplifier 2 and a row decoder 4. The sense amplifier 2 is connected to the detection circuit 1, an input circuit 7, a differential amplifier circuit 5, and a column decoder 3. The differential amplifier circuit 5 is connected to an output circuit 8. The input and output circuits 7 and 8 are connected to an I/O buffer 9. The row decoder 4 and column decoder 3 are connected to an address buffer 12. The input circuit 7 is connected to a command buffer 11, which is connected to a control circuit 6. Connected to the control circuit 6 are the sense amplifier 2, column decoder 3, row decoder 4, and a boosting circuit 14.

The command buffer 11 receives command data from the input circuit 7 and transfers the command data to the control circuit 6. The control circuit 6 decodes the command data from the command buffer 11 so as to output various control signals. Operations of the sense amplifier 2, row decoder 4, I/O buffer 9, column decoder 3, and address buffer 12 are controlled by the control signals output from the control circuit 6. The boosting circuit 14 generates a high voltage and an intermediate voltage at the data write time and data deletion time to supply the high voltage and intermediate voltage to the row decoder 4 or memory cell array 10.

The address buffer 12 latches a row address signal and a column address signal from the input circuit 7 and supplies the row address signal to the row decoder 4 while supplies the column address signal to the column decoder 3. The row decoder 4 receives the row address signal from the address buffer 12 to selectively drive the word lines WL0 to WL15 and selection gate lines SGD and SGS, allowing the memory cells in the memory cell array 10, which correspond to one page to be selected at the same time. The column decoder 3 receives the column address signal from the address buffer 12 to selectively drive the bit lines BL1 to BL(n−1).

Figure 3:
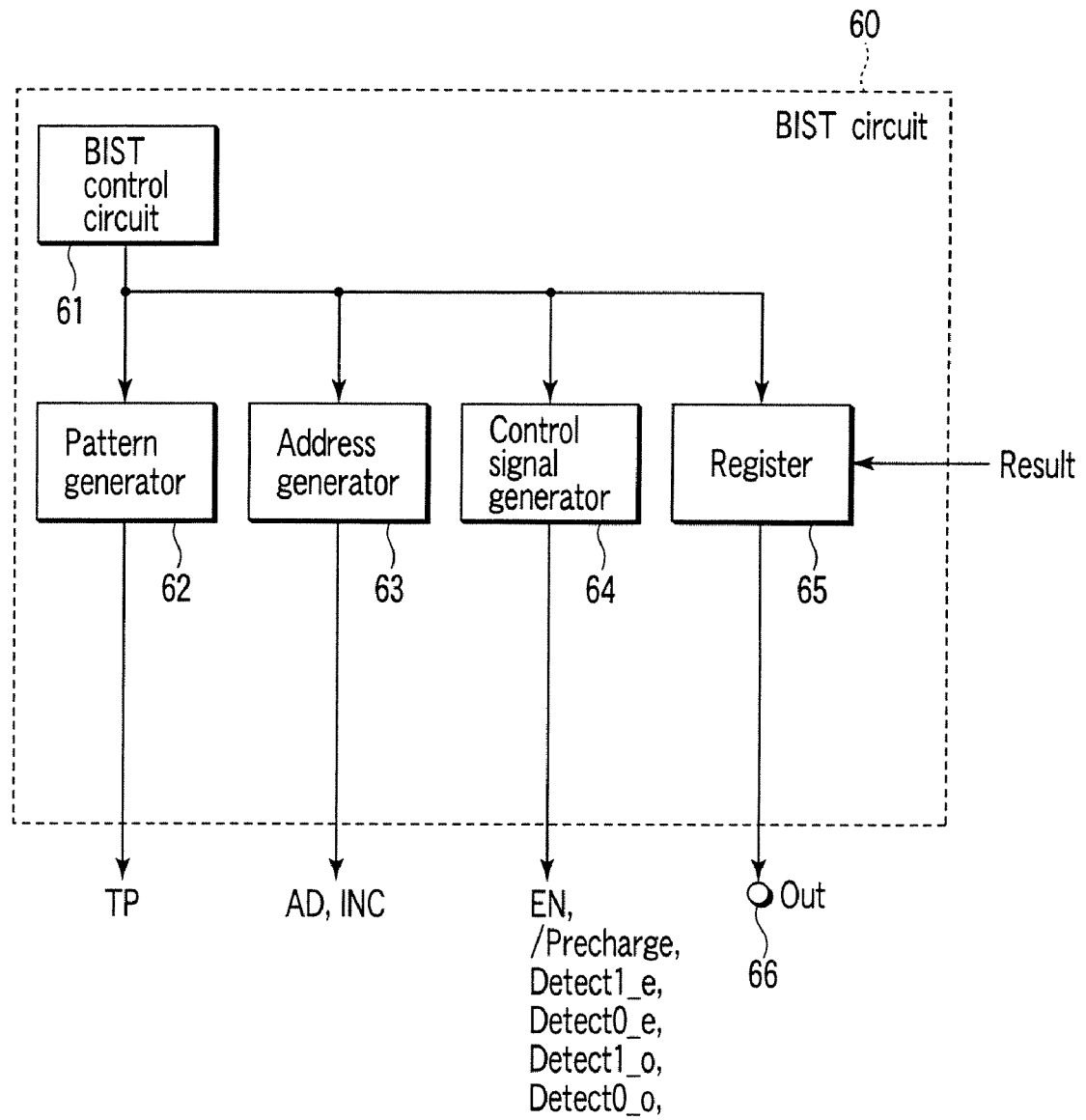
FIG. 3 is a block diagram showing an example of a BIST circuit in the semiconductor memory device according to the first embodiment of the present invention.

The BIST circuit 60 includes, as shown in FIG. 3, a BIST control circuit 61, a pattern generator 62, an address generator 63, a control signal generator 64 and a register 65 which are connected to the BIST control circuit 61. The BIST control circuit 61 controls the pattern generator 62, address generator 63, control signal generator 64 and register 65 to allow them to generate required signals.

The pattern generator 62 generates a test pattern TP to be used in BIST and outputs the test pattern TP to the memory cell array 10 through the sense amplifier 2. The address generator 63 generates memory address data AD which specifies the address of the memory cell array 10 in which the test pattern TP is to be written and an increment signal INC and outputs the memory address data AD and increment signal INC to the column decoder 3 and row decoder 4. The control signal generator 64 generates a control signal EN for controlling BIST operation and outputs the control signal EN to the sense amplifier 2. The control signal generator 64 further generates selection signals DETECT1_e, DETECT1_o, DETECT0_e, DETECT0_o, etc, for controlling the detection circuit 1 and outputs the selection signals to the detection circuit 1. The register 65 acquires in a detection result RESULT from the detection circuit 1 and outputs BIST result OUT to an external output terminal 66.

The sense amplifier 2 includes, as shown in FIG. 4, latch circuits 20, 21, ..., respectively connected to the bit lines $BL_i$, $BL_{i+1}$, ... (i is an even number), for enabling page operation. The latch circuits 20, 21, ..., are made of flip-flop circuits and each include two inverters INV1 and INV2.

At the data read time from the memory cell array 10, the latch circuits 20, 21, ..., temporarily hold the data that have been read through the bit lines $BL_i$, $BL_{i+1}$, ..., in units of a page. When binary 0 is written in the memory cell, binary 1 is read as data N1_n and binary 0 is read as inverted data N0_n. On the other hand, when binary 1 is written in the memory cell, binary 0 is read as data N1_n and binary 1 is read as inverted data N0_n. Among data held in the sense amplifier 2, the data selected in accordance with the output of the column decoder 3 are read to I/O lines IOSA-i/IOSA-i, IOSA-i+1/IOSA-i+1, ..., and the data of I/O lines IOSA-i/IOSA-i, IOSA-i+1/IOSA-i+1, ..., are inverted and read from the I/O buffer 9 to outside of the memory. For example, when binary 0 is written in the memory cell, binary 1 is read to the I/O line IOSA-i as data N1_n, and the data binary 1 of the I/O line IOSA-i is inverted and read to outside of the memory as read data binary 0.

At the data write time to the memory cell array 10, write data are supplied from outside of the memory to the memory cell array 10 through the I/O buffer 9. The write data are input from the input circuit 7, passed through the I/O lines IOSA-i/IOSA-i, IOSA-i+1/IOSA-i+1, ..., input to the latch circuits 20, 21, ..., selected in accordance with the output of the column decoder 3, and are temporarily held in the latch circuits. Then, the write data are supplied to the memory cell array 10 through the bit lines $BL_i$, $BL_{i+1}$, .... The data read system and data write system are separate systems. When the write data supplied from outside of the memory is binary 0, data N1_n is also binary 0, and binary 0 is written in the memory cell.

The column decoder 3 includes transfer transistors Q31 and Q32 which are connected, respectively, between two nodes of the latch circuits 20, 21, . . . , and I/O lines IOSA-i/IOSA-i, IOSA-i+1/IOSA-i+1, . . . . The transfer transistors Q31 and Q32 transfer data N1_n and inverted data N0_n from the latch circuits 20, 21, . . . , to the I/O lines IOSA-i/IOSA-i, IOSA-i+1/IOSA-i+1, . . . , in accordance with a column selection signal CSLn from the address buffer 12.

The detection circuit 1 collectively detects data read to the sense amplifier 2 in units of a page. As shown in FIG. 5, the detection circuit 1 includes even-numbered column selection sections 10e, 11e, 12e, . . . , which are connected respectively to bit lines of byte-based even-numbered column addresses C0, C2, C4, odd-numbered column selection sections 10o, 11o, 12o, . . . , which are connected respectively to bit lines of byte-based odd-numbered column addresses C1, C3, C5, . . . , a NOT gate (inverter) 101 connected to an interconnection wiring DSENSE to which nodes of the even-numbered column selection sections 10e, 11e, 12e, . . . , and odd-numbered column selection sections 10o, 11o, 12o, . . . , are connected in parallel (wired-OR connection), and a detection result holding circuit 102 connected to the inverter 101.

The even-numbered column selection section 10e includes, as shown in FIG. 4, an even-numbered bit line selection section 101e which is connected to an even-numbered bit line $BL_i$ through the sense amplifier 2 and an odd-numbered bit line selection section 101o which is connected to an odd-numbered bit line $BL_{i+1}$ through the sense amplifier 2. The even-numbered bit line selection section 101e includes transistors Qe1 to Qe4. The transistor Qe1 has one end connected to the interconnection wiring DSENSE and controlled by a selection signal DETECT1_e from the BIST circuit 60. The transistor Qe2 has a gate connected to one node of the latch circuit 20 and has one end connected to the other end of the transistor Qe1 and the other end connected to the ground. The transistor Qe3 has one end connected to the interconnection wiring DSENSE and controlled by a selection signal DETECT0_e from the BIST circuit 60. The transistor Qe4 has a gate connected to the other node of the latch circuit 20 and has one end connected to the other end of the transistor Qe3 and the other end connected to the ground. The odd-numbered bit line selection section 101o includes transistors Qo1 to Qo4 having the same configurations as those of the transistors Qe1 to Qe4 of the even-numbered bit line selection sections 101e and, therefore, the connection states of the transistors Qo1 to Qo4 are the same as those of the transistors Qe1 to Qe4 of the even-numbered bit line selection section 101e. That is, the transistor Qo1 has one end connected to the interconnection wiring DSENSE and controlled by the selection signal DETECT1_e from the BIST circuit 60. The transistor Qo2 has a gate connected to one node of the latch circuit 21 and has one end connected to the other end of the transistor Qo1 and the other end connected to the ground. The transistor Qo3 has one end connected to the interconnection wiring DSENSE and controlled by the selection signal DETECT0_e from the BIST circuit 60. The transistor Qo4 has a gate connected to the other node of the latch circuit 21 and has one end connected to the other end of the transistor Qo3 and the other end connected to the ground.

The even-numbered bit line selection section 101e and odd-numbered bit line selection section 101o of the even-numbered column selection section 10e selectively read data N1_n in accordance with the selection signal DETECT1_e or selectively read inverted data N0_n in accordance with the selection signal DETECT0_e. When data is read from the memory cells of the even-numbered column addresses C0, C2, C4, . . . , with the expectation value set as binary 1, the selection signal DETECT1_e is enabled. When data is read from the memory cells of the even-numbered column addresses C0, C2, C4, with the expectation value set as binary 0, the selection signal DETECT0_e is enabled.

The odd-numbered column selection section 10o includes, as shown in FIG. 6, an even-numbered bit line selection section 102e which is connected to an even-numbered bit line $BL_{i+j}$ through the sense amplifier 2 and an odd-numbered bit line selection section 102o which is connected to an odd-numbered bit line $BL_{i+j+1}$ (j is an even number) through the sense amplifier 2. The even-numbered bit line selection section 102e includes transistors Qe5 to Qe8. The transistor Qe5 has one end connected to the interconnection wiring DSENSE and controlled by a selection signal DETECT1_o from the BIST circuit 60. The transistor Qe6 has a gate connected to one node of the latch circuit 20 and has one end connected to the other end of the transistor Qe5 and the other end connected to the ground. The transistor Qe7 has one end connected to the interconnection wiring DSENSE and controlled by a selection signal DETECT0_o from the BIST circuit 60. The transistor Qe8 has a gate connected to the other node of the latch circuit 20 and has one end connected to the other end of the transistor Qe7 and the other end connected to the ground. The odd-numbered bit line selection section 102o includes transistors Qo5 to Qo8 having the same configurations as those of the transistors Qe5 to Qe8 of the even-numbered bit line selection sections 102e and, therefore, the connection states of the transistors Qo5 to Qo8 are the same as those of the transistors Qe5 to Qe8 of the even-numbered bit line selection section 102e. That is, the transistor Qo5 has one end connected to the interconnection wiring DSENSE and controlled by the selection signal DETECT1_o from the BIST circuit 60. The transistor Qo6 has a gate connected to one node of the latch circuit 21 and has one end connected to the other end of the transistor Qo5 and the other end connected to the ground. The transistor Qo7 has one end connected to the interconnection wiring DSENSE and controlled by the selection signal DETEC0_o from the BIST circuit 60. The transistor Qo8 has a gate connected to the other node of the latch circuit 21 and has one end connected to the other end of the transistor Qo7 and the other end connected to the ground.

The even-numbered bit line selection section 102e and odd-numbered bit line selection section 102o of the odd-numbered column selection section 10o selectively read data N1_n in accordance with the selection signal DETECT1_o or selectively read inverted data N0_n in accordance with the selection signal DETECT0_o. When data are read from the memory cells of the odd-numbered column addresses C1, C3, C5, . . . , with the expectation value set as binary 1, the selection signal DETECT0_o is enabled. When data are read from the memory cells of the odd-numbered column addresses C1, C3, C5, . . . , with the expectation value set as binary 0, the selection signal DETECT1_o is enabled.

Although FIG. 4 shows an example of the even-numbered column selection section 10e and FIG. 6 shows an example of the odd-numbered column selection section 10o, the even-numbered column selection sections 11e, 12e, . . . , and odd-numbered column selection sections 10o, 11o, 12o, . . . , shown in FIG. 5 have the same configuration.

The inverter 101 determines that read is pass when all the data in a page are identical and outputs the detection result RESULT indicating pass, while it determines that read is fail when not all the data in a page are identical and outputs the detection result RESULT indicating fail. The detection result holding circuit 102 holds the detection result RESULT from the inverter 101 while synchronizing with an input clock signal CLOCK from the outside and outputs the detection result RESULT to the BIST circuit 60 shown in FIG. 1.

The even-numbered bit line selection section 101e and odd-numbered bit line selection section 101o of the even-numbered column selection section 10e shown in FIG. 4 and even-numbered bit line selection section 102e and odd-numbered bit line selection section 102o of the odd-numbered column selection section 10o shown in FIG. 6 can select different data N1_n and inverted data N0_n based on the selection signals DETECT1_e, DETECT0_e, DETECT1_o, and DETECT0_o. Therefore, in the case where the test patterns are different (0 and 1, and 1 and 0) between the odd-numbered column addresses C1, C3, C5, ..., and even-numbered addresses C0, C2, C4, ..., in the same page, different data N1_n and inverted data N0_n can be selected.

Figures 7, 8:
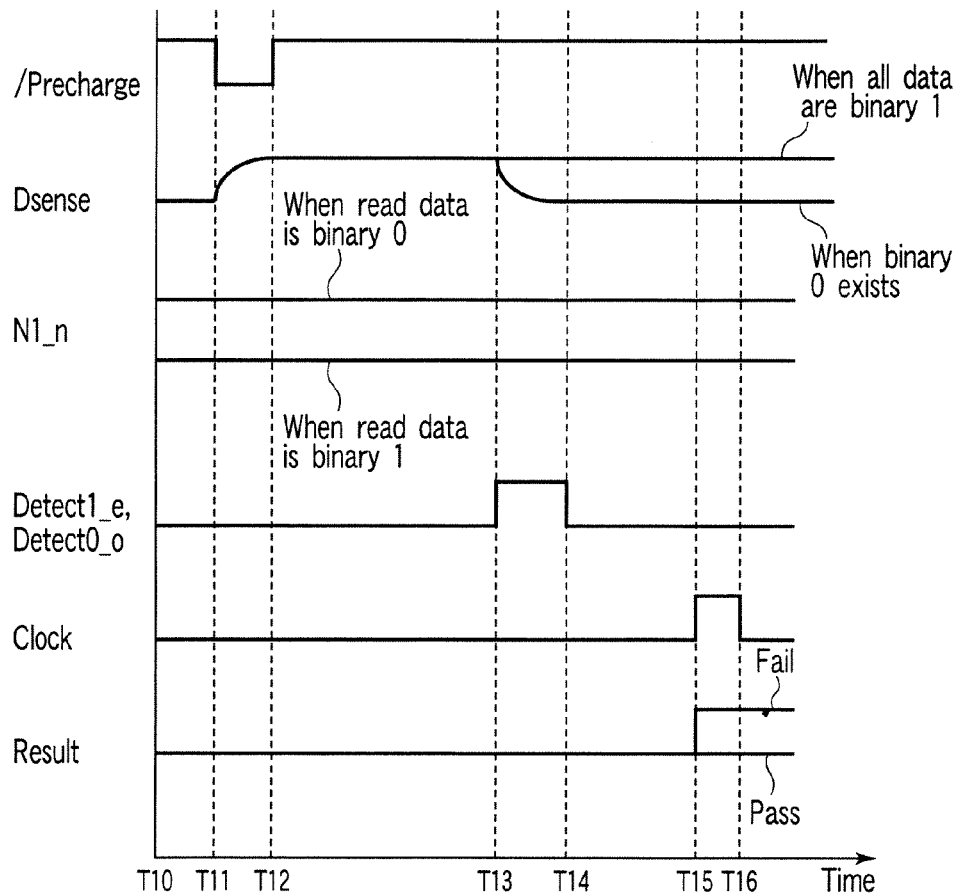
FIG. 7 is a view showing an example of a byte-based checkerboard pattern in the semiconductor memory device according to the first embodiment of the present invention.
FIG. 8 is a timing chart showing an example of BIST method in the semiconductor memory device according to the first embodiment of the present invention.

Therefore, a checkerboard pattern whose example is shown in FIG. 7 can be used as a test pattern for the BIST. The checkerboard pattern is a pattern designed for improving capability of detecting the defect and is configured to check presence/absence of interference between physically adjacent memory cells, bit lines, and word lines. The horizontal axis denotes column addresses C0 to C5, and vertical axis denotes pages P0 to P5. The test pattern is given here in hexadecimal. "FF(11111111)" is written as each byte of even-numbered column addresses C0, C2, C4 and "00(00000000)" is written as each byte of odd-numbered column addresses C1, C3, and C5 in the same pages P0 to P5 so that data are inverted in units of a byte. Further, in the same column addresses C0 to C5, data are inverted for each page.

A defect detection method (BIST method) according to the first embodiment of the present invention will next be described with reference to the timing chart of FIG. 8.

It is assumed, at time $T_{10}$, that the test pattern TP shown in FIG. 7 is generated by the pattern generator 62 shown in FIG. 3 and that the test pattern TP is written, through the I/O lines IOSA-i/IOSA-i, IOSA-i+1/IOSA-i+1, ..., in the memory cells of the memory cell array 10 in units of a page, that is, "FF(111111111)" is written in the memory cells of the even-numbered column addresses C0, C2, C4, ..., and "00(00000000)" is written in the memory cells of the odd-numbered column addresses.

At time $T_{11}$ to $T_{12}$, a precharge signal/PRECHARGE is applied to render the transistor Q10 on to precharge the interconnection wiring DSENSE. At time $T_{13}$ to $T_{14}$, a control signal EN is input to render the transistors Q21, Q22, ... on, shown in FIGS. 4 and 6 and thereby data corresponding to the test pattern TP are read from the memory cell array 10 to sense amplifier 2 in units of a page. The read data are transferred to the latch circuits 20, 21, ..., through the bit lines $BL_i$, $BL_{i+1}$, ..., and temporarily held in the latch circuits.

In the case where data are read from the memory cells of the even-numbered column addresses C0, C2, C4, ..., with the expectation value set as binary 1, the selection signal DETECT1_e is enabled. In the even-numbered column selection section 10e shown in FIG. 4, the even-numbered bit line selection section 101e and odd-numbered bit line selection section 101o selectively read data N1_n from the latch circuits 20, 21, ... based on the selection signal DETECT1_e. In the case where data are read from the memory cells of the even-numbered column addresses C0, C2, C4, ..., with the expectation value set as binary 0, the selection signal DETECT0_e should be enabled.

When the selection signal DETECT1_e is enabled with the expectation value set as binary 1, if write/read operations for the memory cell to be tested are normally performed and the data read from the memory cell is identical to the expectation value, the read data N1_n is binary 0, Since the data N1_n is binary 0, the transistor Qe2 is not turned on and the voltage of the precharged wiring DSENSE is kept high.

When the selection signal DETECT1_e is enabled with the expectation value set as binary 1, if write/read operations for the memory cell to be tested are not normally performed and the data read from the memory cell is different from the expectation value, the read data N1_n is binary 1. Since the data N1_n is binary 1, the transistor Qe2 is turned on and the voltage of the precharged wiring DSENSE is made low.

In the case where data is read from the memory cells of the odd-numbered column addresses C1, C3, C5, ..., with the expectation value set as binary 0, the selection signal DETECT0_o is enabled. In the odd-numbered column selection section 10o shown in FIG. 6, the even-numbered bit line selection section 102e and odd-numbered bit line selection section 102o selectively read inverted data N0_n from the latch circuits 20, 21, ..., based on the selection signal DETECT0_o. In the case where data are read from the memory cells of the odd-numbered column addresses C1, C3, C5, ..., with the expectation value set as binary 1, the selection signal DETECT1_o should be enabled.

When the selection signal DETECT0_o is enabled with the expectation value set as binary 0, if write/read operations for the memory cell to be tested are normally performed and the data read from the memory cell is identical to the expectation value, the read inverted data N0_n is binary 0, Since the data N0_nis binary 0, the transistor Qe8 is not turned on and the voltage of the precharged wiring DSENSE is kept high.

When the selection signal DETECT0_0 is enabled with the expectation value set as binary 0, if write/read operations for the memory cell to be tested are not normally performed and the data read from the memory cell is different from the expectation value, the read inverted data N0_n is binary 1. Since the data N0_n is binary 1, the transistor Qe8 is turned on and the voltage of the precharged wiring DSENSE is made low.

Since the even-numbered bit line selection sections 101e, 102e, ..., and odd-numbered bit line selection sections 101o, 102o, ..., of the plurality of even-numbered column selection sections 10e, 11e, 12e, ..., and plurality of odd-numbered column selection sections 10o, 11o, 12o, ..., are connected to the interconnection wiring DSENSE in parallel, if any of the read data differs from the expectation value, the potential of the interconnection wiring DSENSE goes low.

At time $T_{15}$ to $T_{16}$, the external clock signal CLOCK is input to the detection result holding circuit 102. If the potential of the interconnection wiring DSENSE is kept high at time $T_{16}$, the inverter 101 outputs a low signal indicating that the read operation has normally been performed as the detection result RESULT, while if the potential of the interconnection wiring DSENSE is kept low, the inverter 101 outputs a high signal indicating read fail as the detection result RESULT.

The detection result holding circuit 102 holds the detection result RESULT from the inverter 101 while synchronizing with the CLOCK input from the outside and outputs the detection result. The register 65 of the BIST circuit 60 shown in FIG. 3 takes in the detection result RESULT and outputs BIST result OUT to the outside.

In the BIST, the operations are repeated in response to the input CLOCK signal from the outside, and detection and determination of write and read data of the test pattern are sequentially performed in units of a page. In the case where "00(00000000)" is written in the memory cells of the even-numbered column addresses C0, C2, C4, . . . , and "FF (11111111)" is written in the memory cells of the odd-numbered column address C1, C3, C5, . . . , the selection signals DETECT0_e and DETECT1_0 should be enabled.

Hereinafter, a comparative example of the first embodiment of the present invention will be described. In this comparative example shown in FIG. 9, the detection circuit 1 differs from that shown in FIG. 4 in the point that the even-numbered bit line selection section 101e and odd-numbered bit line selection section 101o of the even-numbered column selection section 10e are controlled by two selection signals DETECT1 and DETECT0. Further, in the comparative example shown in FIG. 10, the detection circuit 1 differs from that shown in FIG. 6 in the point that the even-numbered bit line selection section 102e and odd-numbered bit line selection section 102o of the odd-numbered column selection section 10o are controlled by two selection signals DETECT1 and DETECT0. That is, in these comparative examples, the even-numbered bit line selection sections and odd-numbered bit line selection sections respectively in the even-numbered column selection section 10e and odd-numbered column selection section 10o are controlled by the selection signals DETECT1 and DETECT0.

Figure 9:
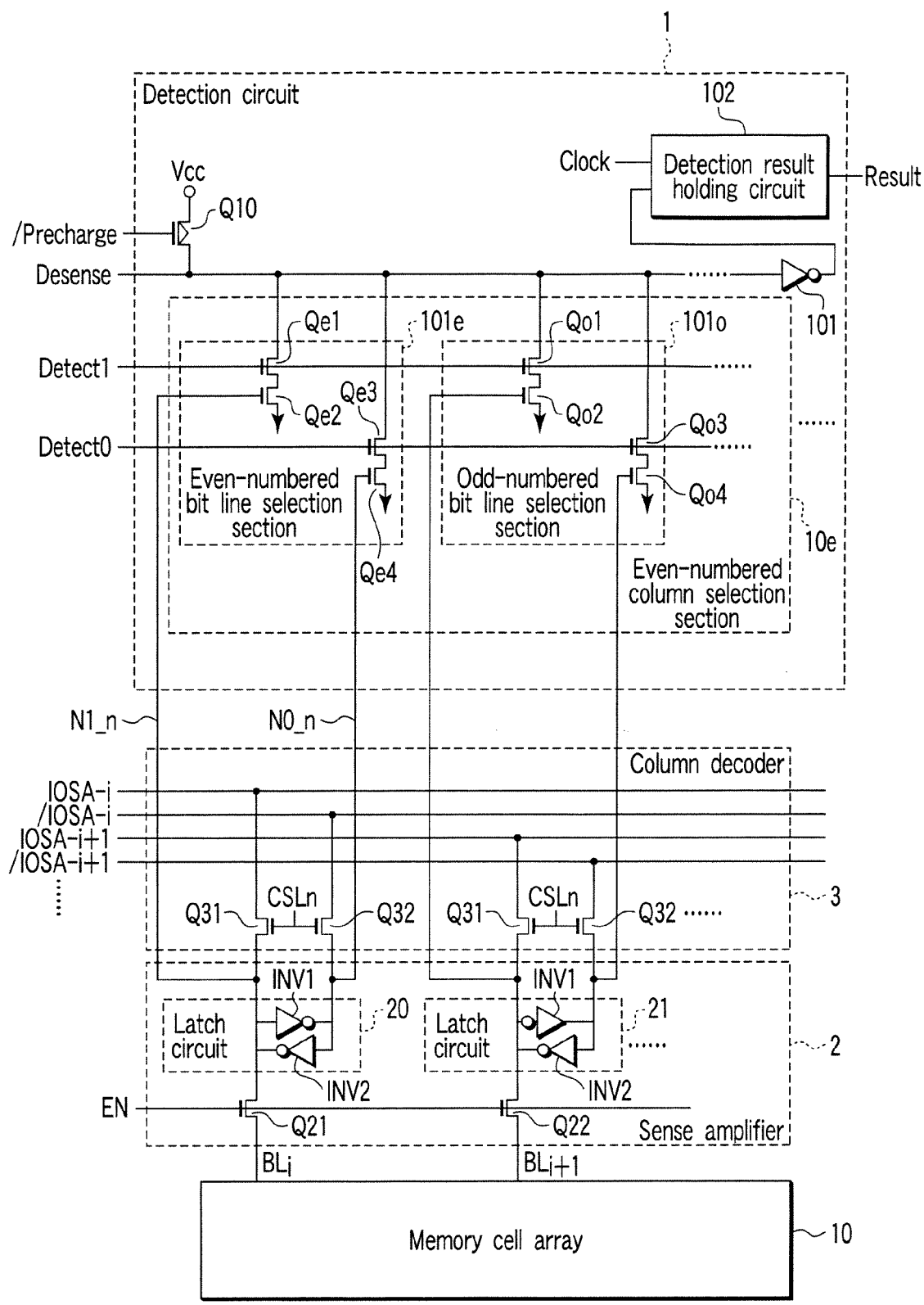
FIG. 9 is a block diagram showing a semiconductor memory device according to a comparative example of the semiconductor memory device according to the first embodiment, which shows a part of its detection circuit in detail.
Figure 10:
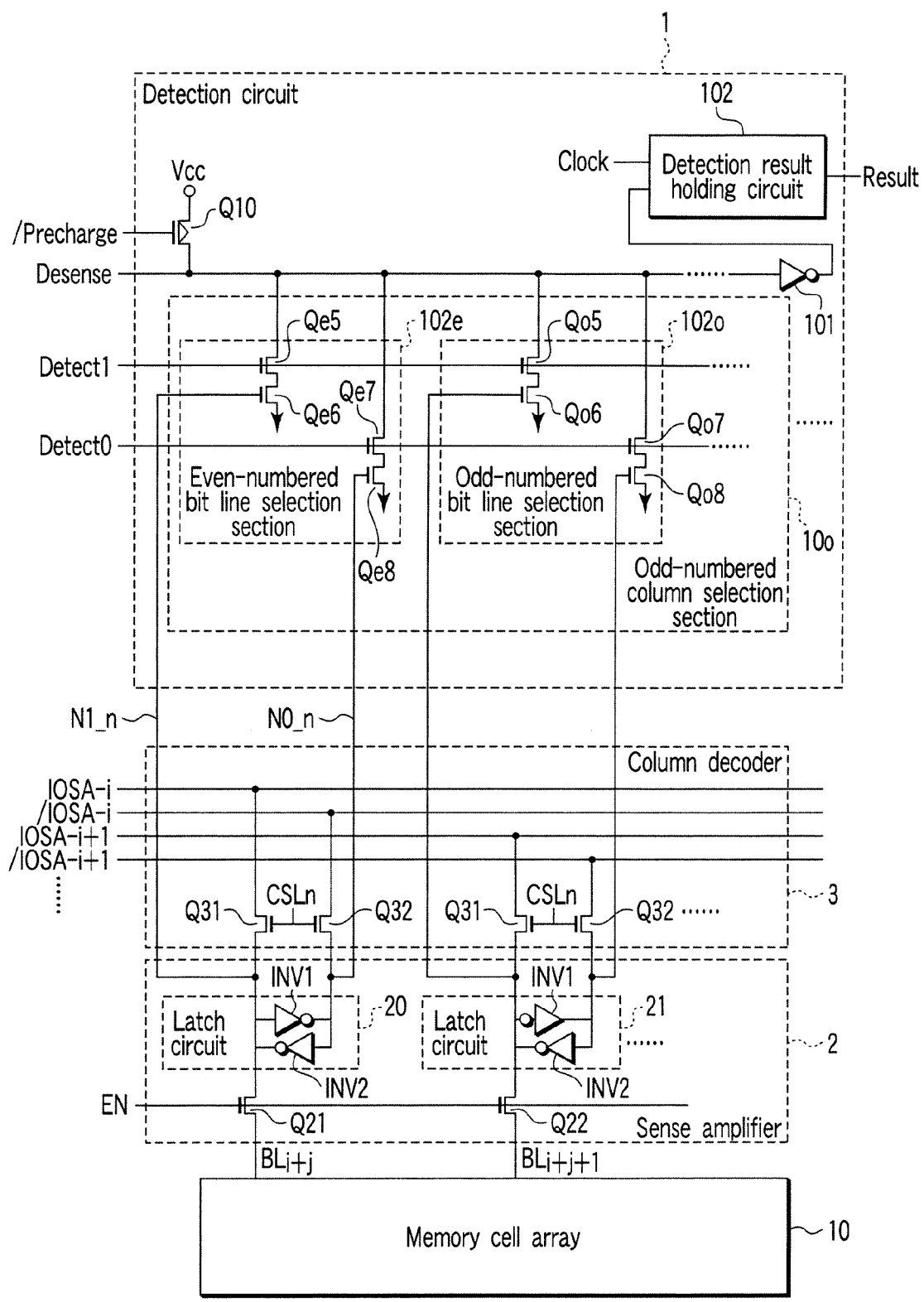
FIG. 10 is a block diagram showing a semiconductor memory device according to the comparative example of the semiconductor memory device according to the first embodiment, which shows a part of its detection circuit in detail.

That is, in the comparative examples shown in FIGS. 9 and 10, the even-numbered column selection section 10e and odd-numbered column selection section 10o are controlled by the same selection signals DETECT1 and DETECT0, so that only the same data N1_n or only the same inverted data N0_n can be selected between the even-numbered column selection section 10e and odd-numbered column selection section 10o. Therefore, only a test pattern of All Binary 0 or test pattern of All Binary 1 can be used.

On the other hand, according to the first embodiment of the present invention, the even-numbered column selection sections 10e, 11e, 12e, . . . , and odd-numbered column selection sections 10o, 11o, 12o, are controlled by different selection signals, i.e., the even-numbered column selection sections 10e, 11e, 12e, . . . , are controlled by the selection signals DETECT1_e and DETECT0_e, and odd-numbered column selection sections 10o, 11o, 12o, . . . , are controlled by selection signals DETECT1_o and DETECT0_o. Therefore, different data, i.e., data N1_n and inverted data N0_n can be selected between the even-numbered column selection sections 10e, 11e, 12e, . . . , and odd-numbered column selection sections 10o, 11o, 12o, As a result, not only the test pattern of All Binary 1 or All Binary 0, but also a test pattern which differs for each page, such as the checkerboard pattern as shown in FIG. 7 can be used to collectively detect a plurality of data. Thus, it is possible to perform a test for defect detection with higher efficiency than in the case where the test pattern of All Binary 0 or All Binary 1 is used to perform the BIST.

The column decoder 3 may be used to selectively enable the column selection signals CSLn and CSLm to thereby selectively detect a plurality of data. This allows selective detection of the defect for a part of the memory cells in a page.

(Modification)

FIG. 11 shows, as a modification of the first embodiment, another example of the detection circuit 1 shown in FIGS. 4 and 6. In the detection circuit 1 according to the modification, the even-numbered column selection section 10e includes the even-numbered bit line selection section 101e connected to the even-numbered bit line $BL_i$ and odd-numbered bit line selection section 101o connected to the odd-numbered bit line $BL_{i+1}$. A difference from the even-numbered column selection section 10e in FIG. 4 is that the even-numbered bit line selection section 101e is controlled by the selection signals DETECT1_e and DETECT0_e and odd-numbered bit line selection section 101o is controlled by the selection signals DETECT1_o and DETECT0_o in the same byte. The odd-numbered column selection section 10c has the same configuration as that of the even-numbered column selection section 10e of FIG. 11.

The even-numbered bit line selection section 101e selectively reads the data N1_n in accordance with the selection signal DETECT1_e and selectively reads the inverted data N0_n in accordance with the selection signal DETECT0_e. In the case where data is read from the memory cell of the even-numbered bit line $BL_i$ with the expectation value set as binary 1, the selection signal DETECT1_e is enabled, while in the case where data is read from the memory cell of the even-numbered bit line $BL_i$ with the expectation value set as binary 0, the selection signal DETECT0_e is enabled.

The odd-numbered bit line selection section 101o selectively reads the data N1_n in accordance with the selection signal DETECT1_o and selectively reads the inverted data N0_n in accordance with the selection signal DETECT0_o. In the case where data is read from the memory cell of the odd-numbered bit line $BL_{i+1}$ with the expectation value set as binary 1, the selection signal DETECT1_o is enabled, while in the case where data is read from the memory cell of the even-numbered bit line $BL_{i+1}$ with the expectation value set as binary 0, the selection signal DETECT0_o is enabled.

Figure 12:
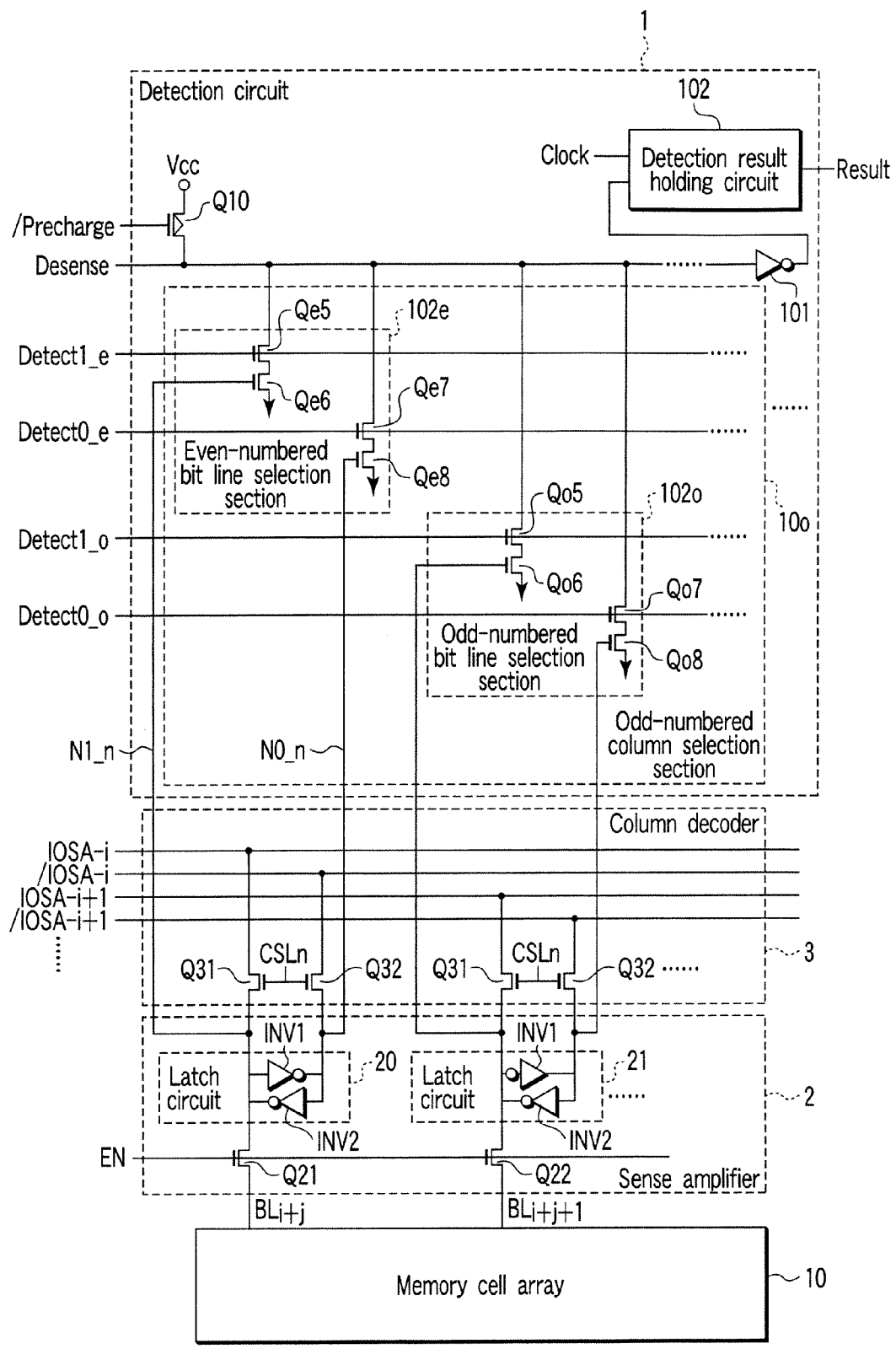
FIG. 12 is a block diagram showing a semiconductor memory device according to the modification of the semiconductor memory device according to the first embodiment, which shows a part of its detection circuit in detail.

The odd-numbered column selection section 10o has the same configuration as that of the even-numbered column selection section 10e shown in FIG. 11, and FIG. 12 shows another example of the detection circuit 1 shown in FIG. 6. In this detection circuit 1, the odd-numbered column selection section 10o includes the even-numbered bit line selection section 102e connected to the even-numbered bit line $BL_{i+1}$ and odd-numbered bit line selection section 102o connected to the odd-numbered bit line $BL_{i+j+1}$. A difference from the odd-numbered column selection section 10o shown in FIG. 6 is that the even-numbered bit line selection section 102e is controlled by the selection signals DETECT1_e and DETECT0_e and odd-numbered bit line selection section 102o is controlled by the selection signals DETECT1_o and DETECT0_o in the same byte.

The even-numbered bit line selection section 102e selectively reads the data N1_n in accordance with the selection signal DETECT1_e and selectively reads the inverted data N0_n in accordance with the selection signal DETECT0_e. In the case where data is read from the memory cell of the even-numbered bit line $BL_{i+j}$ with the expectation value set as binary 1, the selection signal DETECT1_e is enabled, while in the case where data is read from the memory cell of the even-numbered bit line $BL_{i+j}$ with the expectation value set as binary 0, the selection signal DETECT0_e is enabled.

The odd-numbered bit line selection section 102o selectively reads the data N1_n in accordance with the selection signal DETECT1_o and selectively reads the inverted data N0_n in accordance with the selection signal DETECT0_o. In the case where data is read from the memory cell of the odd-numbered bit line $BL_{i+j+1}$ with the expectation value set as binary 1, the selection signal DETECT1_o is enabled, while in the case where data is read from the memory cell of the odd-numbered bit line $BL_{i+j+1}$ with the expectation value set as binary 0, the selection signal DETECT0_o is enabled.

As described above, the different data N1_n and inverted data N0_n can be selected even in the same byte, so that a plurality of data can collectively be detected even when different test patterns are used for the adjacent bits. Therefore, a bit-based checkerboard pattern as shown in FIG. 13 can be used as a test pattern.

In FIG. 13, the horizontal axis denotes column addresses C0 to C5, and vertical axis denotes pages P0 to P5. The test pattern is given here in hexadecimal. In the checkerboard pattern shown in FIG. 13, data is inverted in units of a bit in the same pages P0 to P5. Further, data is inverted for each page in the same column addresses C0 to C5. For example, "AA (10101010)" is written in each byte code of all column addresses C0 to C5 in the pages P0, P2, and P4 and "55 (01010101)" is written in each byte code of all column addresses C0 to C5 in the pages P1, P3, and P5.

According to the modification of the first embodiment of the present invention, it is possible to use different test patters for the adjacent bits in the byte code, such as the bit-based checkerboard pattern shown in FIG. 13, thereby performing in an efficient manner the test for detecting the defect due to interference of the adjacent bit lines.

Second Embodiment

Figure 14:
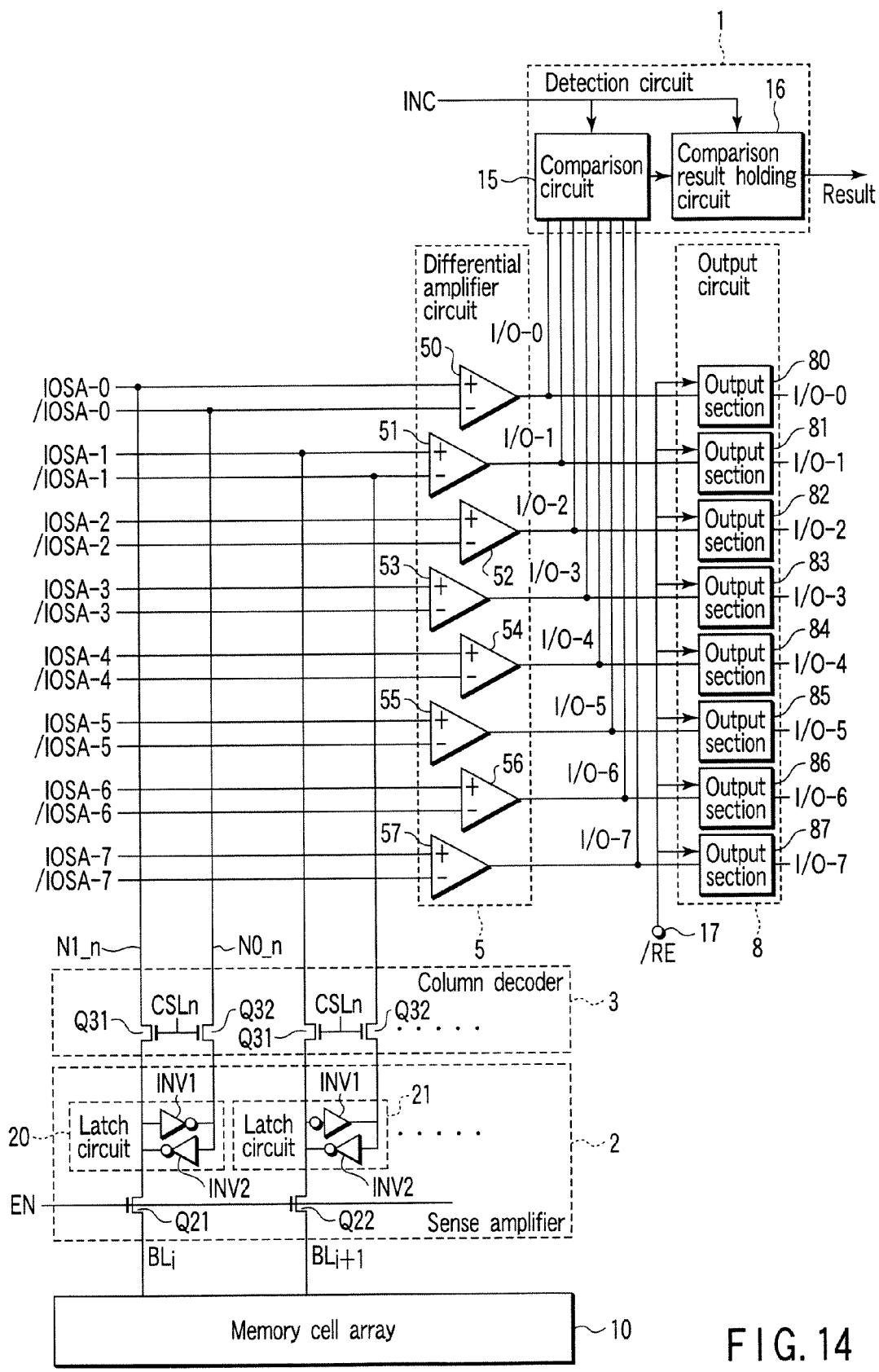
FIG. 14 is a block diagram showing, in detail, a part of a differential amplifier circuit, sense amplifier, column decoder, and detection circuit in a semiconductor memory device according to a second embodiment of the present invention.

A semiconductor memory device according to a second embodiment of the present invention includes, as shown in FIG. 14, a detection circuit 1 on the output side of the differential amplifier circuit 5. The differential amplifier circuit 5 includes a plurality of differential amplifiers 50 to 57 connected to the I/O lines IOSA-i/IOSA-i, IOSA-i+1/IOSA-i+1, . . . . The plurality of differential amplifiers 50 to 57 amplify the voltage differences between the read data N1_n and inverted data N0_n and output the voltage differences through IOI signal lines I/O-0 to I/O-7.

The output circuit 8 includes a plurality of output sections 80 to 87 connected to the differential amplifiers 50 to 57 through the IOI signal lines I/O-0 to I/O-7. The output sections 80 to 87 hold data from the IOI signal lines I/O-0 to I/O-7 while synchronizing with a clock /RE input from the outside and output the held data to the I/O buffer 9.

Figures 15, 16:
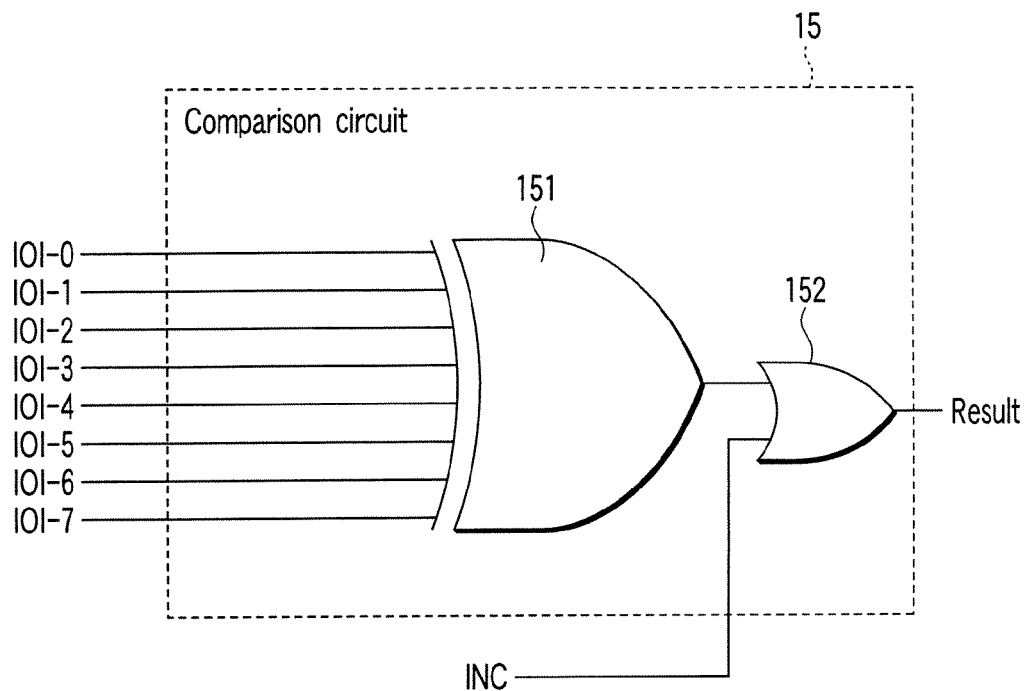
FIG. 15 is a circuit diagram showing an example of a comparison circuit in the semiconductor memory device according to the second embodiment of the present invention.
FIG. 16 is a view schematically showing an example of a diagonal pattern in the semiconductor memory device according to the second embodiment of the present invention.

The detection circuit 1 collectively detects data from the IOI signal lines I/O-0 to I/O-7. The detection circuit 1 includes a comparison circuit 15 connected to the output sides of the differential amplifiers 50 to 57 through the IOI signal lines I/O-0 to I/O-7 and a comparison result holding circuit 16 connected to the comparison circuit 15. The comparison circuit 15 compares data from the IOI signal lines I/O-0 to I/O-7 while synchronizing with an increment signal INC and outputs a comparison result. As shown in FIG. 15, the comparison circuit 15 includes an EXOR gate 151 connected to eight IOI signal lines in the byte and an OR gate 152 connected to the EXOR gate 151. When all the data in the byte are identical, the EXOR gate 151 outputs a high signal indicating read pass as the comparison result (detection result) RESULT, while when not all the data in the byte are identical, the EXOR gate 151 outputs a low signal indicating read fail as the comparison result RESULT. The OR gate 152 outputs the comparison result RESULT from the EXOR gate 151 while synchronizing with the increment signal INC.

The comparison result holding circuit 16 in the semiconductor memory device of FIG. 14 sequentially takes in the comparison results while synchronizing the increment signal INC and transfers the comparison results to the BIST circuit 60.

Other configurations are the same as those of the semiconductor memory device of FIG. 1, and the overlapped description will be omitted. Although one detection circuit 1 corresponding to one byte is shown in FIG. 14, a plurality of detection circuits corresponding to respective bytes may actually be provided.

In the second embodiment of the present invention, a diagonal pattern as shown in FIG. 16 can be used as a test pattern. The horizontal axis denotes the column addresses C0 to C5, and vertical axis denotes the pages P0 to P5. The test pattern is given here in hexadecimal. The diagonal pattern is a pattern for checking whether addressing is normally performed.

A collective detection method (BIST method) according to the second embodiment of the present invention will be described. It is assumed that the diagonal pattern shown in FIG. 16 is written in units of a page through the I/O lines IOSA-i/IOSA-i, IOSA-i+1/IOSA-i+1, . . . , from the pattern generator 62. In the second embodiment, the data N1_n or inverted data N0_n is read from the latch circuits 20, 21, . . . , to the IOI signal lines I/O-0 to I/O-7 while the column address is being incremented in synchronization with the increment signal INC. The control signal EN is applied to the gates of transistors Q21 and Q22 to turn the transistors on, and thereby data are read to the sense amplifier 2 through the bit lines $BL_i$ and $BL_{i+1}$, . . . . The read data are held in the latch circuits 20, 21, . . . . The column selection signal CSLn is input from the address buffer 12 to the gates of transistors Q31 and Q32 to turn the transistors on, and the data N1_n and inverted data N0_1 held by the latch circuits 20, 21, . . . , are transferred to the I/O lines IOSA-i/IOSA-i, IOSA-i+1/IOSA-i+1, . . . .

The differential amplifiers 50 to 57 amplify the potential differences between the data N1_n and inverted data N0_n and output the potential differences to the IOI signal lines I/O-0 to I/O-7. The EXOR gate 151 receives data from the byte-based IOI signal lines I/O-0 to I/O-7. When all the data in the byte are identical, the EXOR gate 151 determines that the read is pass and outputs a low signal as a comparison result. On the other hand, when not all the data in the byte are identical, the EXOR gate 151 determines that the read is fail and outputs a high signal as a comparison result. The OR gate 152 outputs a comparison result RESULT while synchronizing with the increment signal INC. The comparison result RESULT is input to the BIST circuit 60 and then output to the outside.

According to the second embodiment of the present invention, not only a checkerboard pattern but also a diagonal pattern can be used to detect the defect in the BIST circuit 60 as long as data in the byte are the same. Further, even with a random pattern independent of the column address and page address, it is possible to detect the defect in the BIST circuit 60.

(First Modification)

Figure 17:
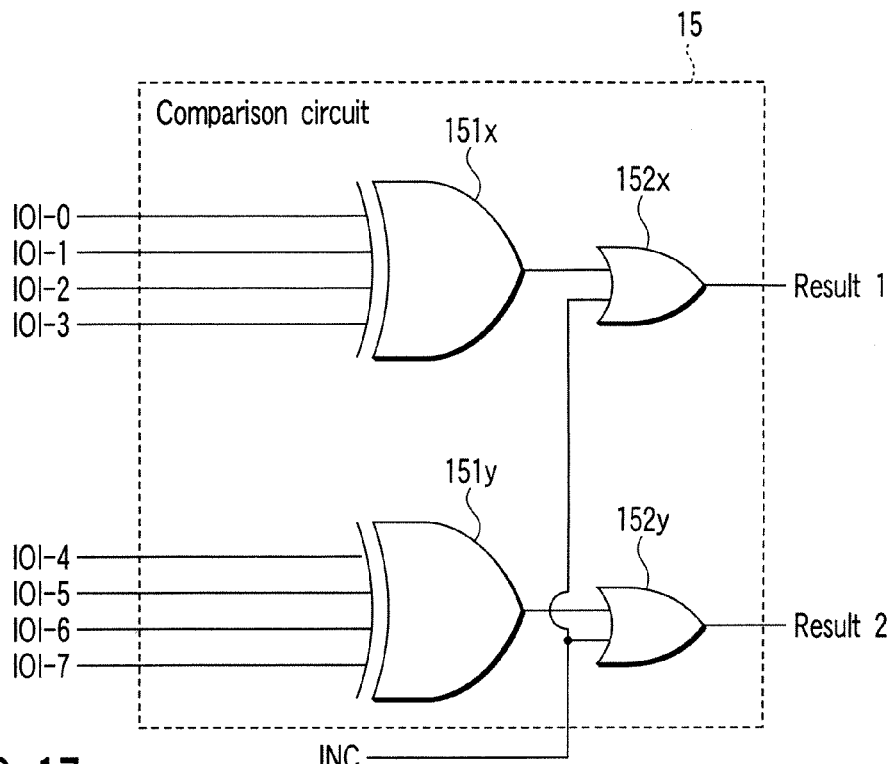
FIG. 17 is a circuit diagram showing a first modification of the comparison circuit in the semiconductor memory device according to the second embodiment of the present invention.

As a first modification of the comparison circuit 15 shown in FIG. 15 in the semiconductor memory device according to the second embodiment, FIG. 17 shows a comparison circuit including EXOR gates 151x and 151y connected respectively to data I/O-0 to I/O-3 of the first four bits of the byte and data I/O-4 to I/O-7 of the second four bits of the byte and OR gates 152x and 152y connected respectively to the EXOR gates 151x and 151y.

When all the data of the first four bits of the byte are identical, the EXOR gate 151x outputs a high signal. When not all the data of the first four bits of the byte are identical, the EXOR gate 151x outputs a low signal. The OR gate 152x outputs the comparison result RESULT1 from the EXOR gate 151x while synchronizing with the increment signal INC.

When all the data of the second four bits of the byte are identical, the EXOR gate 151y outputs a high signal. When not all the data of the second four bits of the byte are identical, the EXOR gate 151y outputs a low signal. The OR gate 152y outputs the comparison result RESULT2 from the EXOR gate 151y while synchronizing with the increment signal INC.

A use of the comparison circuit 15 shown in FIG. 17 allows the first four bits data and second four bits data in the same byte to be separately detected at a time, so that setting of a test pattern can be made separately for the first and second parts in the byte. Therefore, flexibility of the test can be increased to thereby improve the defect detection efficiency.

(Second Modification)

Figure 18:
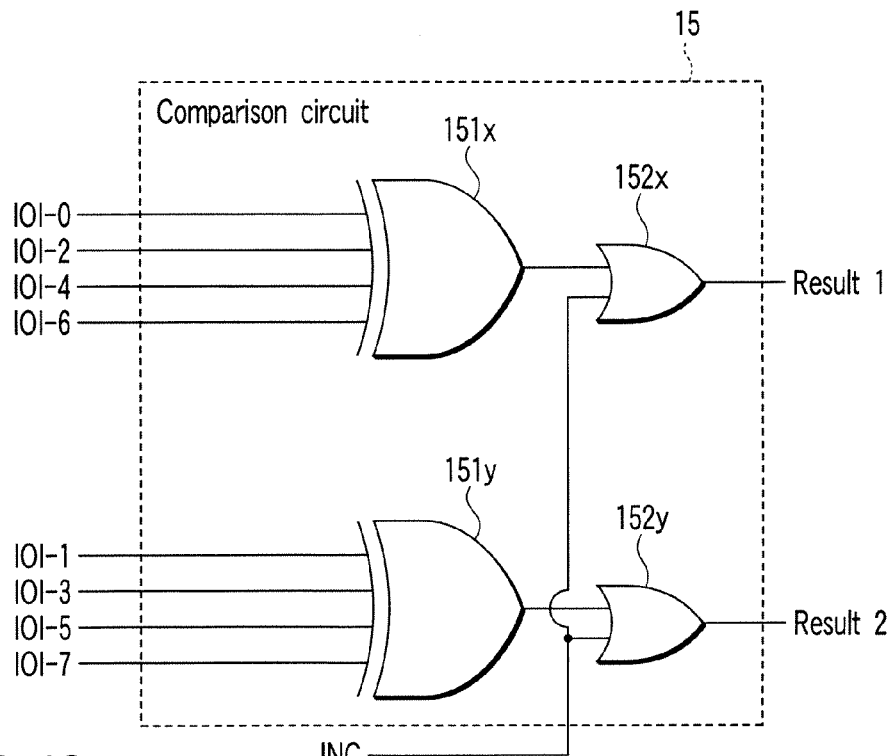
FIG. 18 is a circuit diagram showing a second modification of the comparison circuit in the semiconductor memory device according to the second embodiment of the present invention.

As a second modification of the comparison circuit 15 shown in FIG. 15 in the semiconductor memory device according to the second embodiment, FIG. 18 shows a comparison circuit including EXOR gates 151x and 151y connected respectively to even-numbered I/O-0, 2, 4, and 6 and odd-numbered I/O-1, 3, 5, and 7 in the byte and OR gates 152x and 152y connected respectively to the EXOR gates 151x and 151y.

When all the data of the even-numbered bits of the byte are identical, the EXOR gate 151x outputs a high signal. When not all the data of the even-numbered bits of the byte are identical, the EXOR gate 151x outputs a low signal. The OR gate 152x outputs the comparison result RESULT1 from the EXOR gate 151x while synchronizing with the increment signal INC.

When all the data of the odd-numbered bits of the byte are identical to binary 0, the EXOR gate 151y outputs a high signal. When not all the data of the odd-numbered bits of the byte are identical to binary 0, the EXOR gate 151y outputs a low signal. The OR gate 152y outputs the comparison result RESULT2 from the EXOR gate 151y while synchronizing with the increment signal INC.

A use of the comparison circuit 15 shown in FIG. 18 allows the even-numbered bits and odd-numbered bits in the same byte to be separately detected at a time, so that setting of a test pattern can be made separately for the even-numbered bits and odd-numbered bits in the byte. Therefore, flexibility of the test can be increased to thereby improve the defect detection efficiency.

Although the present invention has been described with reference to the first and second embodiments, the present invention is not limited to the above embodiments. For example, a test pattern to be used in the BIST may be generated in an external automatic test pattern generation circuit (ATPG) or the like. Further, although the semiconductor memory device receives the input clock signal CLOCK from an external device in the embodiments, it may be provided with a clock generation circuit. Further, although the detection circuit 1 collectively detects a plurality of data in units of a page in the above embodiments, a plurality of detection circuits may be used to detect the data in units of a byte.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array including a plurality of memory cells;
a built-in self-test circuit which writes test pattern data including binary 0 and binary 1 in the memory cells in units of a page to perform a test for the memory cells;
a plurality of sense amplifiers which hold a plurality of data read from the memory cells in units of a page; and
a detection circuit which collectively detects the plurality of data held by the sense amplifiers and outputs a detection result to the built-in self-test circuit.

2. The semiconductor memory device according to claim 1, wherein the detection circuit collectively detects the plurality of data in units of a page or byte.

3. The semiconductor memory device according to claim 1, wherein the detection circuit comprises a comparison circuit which compares the data in units of a byte with each other.

4. The semiconductor memory device according to claim 1, wherein the built-in self-test circuit receives the detection result from the detection circuit and, when not all the plurality of data are identical, determines that a defect exists.

5. The semiconductor memory device according to claim 1, wherein the detection circuit comprises:
an even-numbered column selection section which is connected to the sense amplifiers and which selects the data in units of a byte of even-numbered column addresses of the memory cells;
an odd-numbered column selection section which is connected to the sense amplifiers and which selects inverted data of the data in units of a byte of odd-numbered column addresses of the memory cells; and
an inverter to which the even-numbered column selection section and odd-numbered column selection section are connected in parallel and which collectively detects the data in units of a byte of the even-numbered column addresses and data in units of a byte of the odd-numbered column addresses.

6. The semiconductor memory device according to claim 5, wherein
the sense amplifiers comprises a plurality of latch circuits which are provided for respective bit lines and each include parallel-connected two inverters,
the even-numbered column selection section of the detection circuit comprises an even-numbered bit line selection section including a transistor circuit which is connected to a first node of a first latch circuit provided corresponding to a first even-numbered bit line and which outputs data of the first node of the first latch circuit to the detection circuit under control of a first detection control signal and a transistor circuit which is connected to a second node of the first latch circuit and which outputs data of the second node of the first latch circuit to the detection circuit under control of a second detection control signal, and an odd-numbered bit line selection section including a transistor circuit which is connected to a first node of a second latch circuit provided corresponding to a first odd-numbered bit line and which outputs data of the first node of the second latch circuit to the detection circuit under control of the first detection control signal and a transistor circuit which is connected to a second node of the second latch circuit and which outputs data of the second node of the second latch circuit to the detection circuit under control of the second detection control signal, and
the odd-numbered column selection section of the detection circuit comprises an even-numbered bit line selection section including a transistor circuit which is connected to a first node of a third latch circuit provided corresponding to a second even-numbered bit line and which outputs data of the first node of the third latch circuit to the detection circuit under control of a third detection control signal and a transistor circuit which is connected to a second node of the third latch circuit and which outputs data of the second node of the third latch circuit to the detection circuit under control of a fourth detection control signal, and an odd-numbered bit line selection section including a transistor circuit which is connected to a first node of a fourth latch circuit provided corresponding to a second odd-numbered bit line and which outputs data of the first node of the fourth latch circuit to the detection circuit under control of the third detection control signal and a transistor circuit which is connected to a second node of the fourth latch circuit and which outputs data of the second node of the fourth latch circuit to the detection circuit under control of the fourth detection control signal.

7. The semiconductor memory device according to claim 5, wherein the sense amplifiers comprises a plurality of latch circuits which are provided for respective bit lines and each include parallel-connected two inverters, the even-numbered column selection section of the detection circuit comprises an even-numbered bit line selection section including a transistor circuit which is connected to a first node of a first latch circuit provided corresponding to a first even-numbered bit line and which outputs data of the first node of the first latch circuit to the detection circuit under control of a first detection control signal and a transistor circuit which is connected to a second node of the first latch circuit and which outputs data of the second node of the first latch circuit to the detection circuit under control of a second detection control signal, and an odd-numbered bit line selection section including a transistor circuit which is connected to a first node of a second latch circuit provided corresponding to a first odd-numbered bit line and which outputs data of the first node of the second latch circuit to the detection circuit under control of a third detection control signal and a transistor circuit which is connected to a second node of the second latch circuit and which outputs data of the second node of the second latch circuit to the detection circuit under control of a fourth detection control signal, and the odd-numbered column selection section of the detection circuit comprises an even-numbered bit line selection section including a transistor circuit which is connected to a first node of a third latch circuit provided corresponding to a second even-numbered bit line and which outputs data of the first node of the third latch circuit to the detection circuit under control of the first detection control signal and a transistor circuit which is connected to a second node of the third latch circuit and which outputs data of the second node of the third latch circuit to the detection circuit under control of the second detection control signal and an odd-numbered bit line selection section including a transistor circuit which is connected to a first node of a fourth latch circuit provided corresponding to a second odd-numbered bit line and which outputs data of the first node of the fourth latch circuit to the detection circuit under control of the third detection control signal and a transistor circuit which is connected to a second node of the fourth latch circuit and which outputs data of the second node of the fourth latch circuit to the detection circuit under control of the fourth detection control signal.

8. The semiconductor memory device according to claim 1, further comprising a plurality of column decoders and a plurality of differential amplifiers, wherein the sense amplifiers comprise a plurality of latch circuits which are provided for respective bit lines and each include parallel-connected two inverters, the column decoders comprise a plurality of decoder circuits which are provided for respective bit lines and each include first and second transfer transistors whose gates are connected to each other, wherein one end of the first transfer transistor of each decoder circuit is connected to a first node of the latch circuit of a corresponding sense amplifier and one end of the second transfer transistor of each decoder circuit is connected to a second node of the latch circuit of the corresponding sense amplifier, the differential amplifiers comprise a plurality of differential amplifier circuits which are provided corresponding to respective bit lines and each include first and second input terminals connected respectively to the other ends of the first and second transfer transistors of the decoder circuit of a corresponding column decoder, each of the differential amplifier circuits being configured to amplify a voltage difference between data of the first and second nodes of the latch circuit of a corresponding sense amplifier, and the detection circuit comprises a comparison circuit which compares a plurality of data in units of a byte output from the plurality of differential amplifier circuits and outputs the comparison result.

9. The semiconductor memory device according to claim 8, wherein the comparison circuit is an exclusive OR circuit which receives the plurality of data in units of a byte output from the plurality of differential amplifier circuits and outputs the detection result.

10. The semiconductor memory device according to claim 8, wherein the comparison circuit comprises a first comparison circuit which compares first four bits of the plurality of data in units of a byte output from the differential amplifier circuits and outputs a first detection result and a second comparison circuit which compares second four bits of the plurality of data in units of a byte output from the differential amplifier circuits and outputs a second detection result.

11. The semiconductor memory device according to claim 10, wherein the first comparison circuit is a first exclusive OR circuit which receives the first four bits of the plurality of data in units of a byte output from the differential amplifier circuits and outputs the first detection result, and the second comparison circuit is a second exclusive OR circuit which receives the second four bits of the plurality of data in units of a byte output from the differential amplifier circuits and outputs the second detection result.

12. The semiconductor memory device according to claim 8, wherein the comparison circuit comprises a first comparison circuit which compares even-numbered bits of the plurality of data in units of a byte output from the plurality of differential amplifier circuits and outputs a first detection result and a second comparison circuit which compares odd-numbered bits of a plurality of data in units of a byte output from the plurality of differential amplifier circuits and outputs a second detection result.

13. The semiconductor memory device according to claim 12, wherein the first comparison circuit is a first exclusive OR circuit which receives the even-numbered bits of the plurality of data in units of a byte output from the differential amplifier circuits and outputs the first detection result, and the second comparison circuit is a second exclusive OR circuit which receives the odd-numbered bits of the plurality of data in units of a byte output from the differential amplifier circuits and outputs the second detection result.

14. The semiconductor memory device according to claim 1, wherein the test pattern includes a checkerboard pattern.

15. The semiconductor memory device according to claim 1, wherein the semiconductor memory device is a NAND flash memory.

* * * * *